(12) United States Patent
Noguchi et al.

(10) Patent No.: US 12,392,053 B2
(45) Date of Patent: Aug. 19, 2025

(54) GROUP 13 ELEMENT NITRIDE CRYSTAL LAYER, SELF-SUPPORTING SUBSTRATE, AND FUNCTIONAL ELEMENT

(71) Applicant: NGK INSULATORS, LTD., Nagoya (JP)

(72) Inventors: Suguru Noguchi, Nagoya (JP); Takayuki Hirao, Toyota (JP); Yoshinori Isoda, Ichinomiya (JP); Tetsuya Uchikawa, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 563 days.

(21) Appl. No.: 17/747,501

(22) Filed: May 18, 2022

(65) Prior Publication Data
US 2022/0275532 A1    Sep. 1, 2022

Related U.S. Application Data

(63) Continuation of application No. PCT/JP2020/027467, filed on Jul. 15, 2020.

(30) Foreign Application Priority Data

Nov. 21, 2019  (JP) ................. 2019-210396

(51) Int. Cl.
  *C30B 29/40*   (2006.01)
  *C30B 19/02*   (2006.01)
  (Continued)

(52) U.S. Cl.
  CPC ............ *C30B 29/406* (2013.01); *C30B 19/02* (2013.01); *C30B 25/18* (2013.01); *H10D 62/8503* (2025.01); *H10H 20/825* (2025.01)

(58) Field of Classification Search
  CPC ....... C30B 19/02; C30B 25/18; C30B 29/406; H01L 21/02; H01L 21/0262;
  (Continued)

(56) References Cited

U.S. PATENT DOCUMENTS

2009/0087936 A1*  4/2009  Miki ................. C30B 29/403
                                                         438/46
2015/0364319 A1* 12/2015  Park ................. H01L 21/02505
                                                         257/615
(Continued)

FOREIGN PATENT DOCUMENTS

DE   112016005626 T5   9/2018
DE   112020004313 T5   6/2022
(Continued)

OTHER PUBLICATIONS

International Search Report with English Translation issued in corresponding International Application No. PCT/JP2020/027467 date of mailing Sep. 24, 2020 (5 pages).
(Continued)

*Primary Examiner* — Vongsavanh Sengdara
(74) *Attorney, Agent, or Firm* — FLYNN THIEL, P.C.

(57) ABSTRACT

A group 13 nitride crystal layer is composed of a group 13 nitride crystal selected from gallium nitride, aluminum nitride, indium nitride or the mixed crystals thereof, and the group 13 nitride crystal layer includes an upper surface and bottom surface. The group 13 nitride crystal layer includes high-luminance layers and low-luminance layers being present alternately, and the low-luminance layers have thicknesses of 3 or larger and 10 or smaller provided that 1 is assigned to a thickness of the high-luminance layer, when a cross section of the group 13 nitride crystal layer cut in a direction perpendicular to the upper surface is observed by cathode luminescence.

14 Claims, 6 Drawing Sheets

(51) Int. Cl.
  *C30B 25/18*   (2006.01)
  *H10D 62/85*   (2025.01)
  *H10H 20/825*  (2025.01)

(58) Field of Classification Search
  CPC ......... H01L 21/02507; H01L 21/02625; H01L 21/0242; H01L 21/02458; H01L 21/02628; H01L 21/02488; H01L 21/0254
  See application file for complete search history.

(56) References Cited

U.S. PATENT DOCUMENTS

| | | | |
|---|---|---|---|
| 2016/0079408 A1* | 3/2016 | Isobe | H01L 21/02507 257/18 |
| 2016/0118486 A1* | 4/2016 | Shikauchi | H10D 30/4732 257/76 |
| 2017/0236906 A1* | 8/2017 | Yamada | H01L 23/562 250/395 |
| 2018/0274128 A1 | 9/2018 | Iwai et al. | |
| 2018/0351038 A1* | 12/2018 | Watanabe | C30B 19/02 |
| 2019/0242029 A1 | 8/2019 | Isoda et al. | |
| 2019/0280156 A1 | 9/2019 | Fujiwara et al. | |
| 2019/0318934 A1* | 10/2019 | Yamamoto | H10D 30/60 |
| 2020/0091371 A1* | 3/2020 | Atanackovic | H10H 20/81 |
| 2020/0190695 A1 | 6/2020 | Hirao et al. | |
| 2020/0232120 A1 | 7/2020 | Hirao et al. | |
| 2022/0199854 A1 | 6/2022 | Sakai et al. | |

FOREIGN PATENT DOCUMENTS

| | | |
|---|---|---|
| WO | 2017098756 A1 | 6/2017 |
| WO | 2018097102 A1 | 5/2018 |
| WO | 2019038892 A1 | 2/2019 |
| WO | 2019038933 A1 | 2/2019 |

OTHER PUBLICATIONS

Written Opinion of International Searching Authority issued in corresponding International Application No. PCT/JP2020/027467 dated Sep. 24, 2020 (4 pages).

Hirofumi Morita, Center News; Cathode luminescence spectroscopy system, vol. 29, No. 2, 2010, No. 108, published by Central analytical center of Kyushu University (6 pages).

Taro Sato et al., Homoepitaxial growth of GaN crystals by Na-flux dipping method, Japanese Journal of Applied Physics, 54, 105501; published Sep. 2, 2015 (6 pages).

Kousuke Murakami, Doctoral Thesis in National University Corporation of Osaka University; Nuclear generation control technique for high-speed growth in the Na flux method, Jan. 2017 (121 pages).

German Office Action with English translation issued in corresponding German Application No. 11 2020 005 284.2, issued Feb. 7, 2024 (16 pages).

English Translation of the International Preliminary Report on Patentability, issued in corresponding International Application No. PCT/JP2020/027467, Date of Mailing Jun. 2, 2022 (6 pages).

* cited by examiner

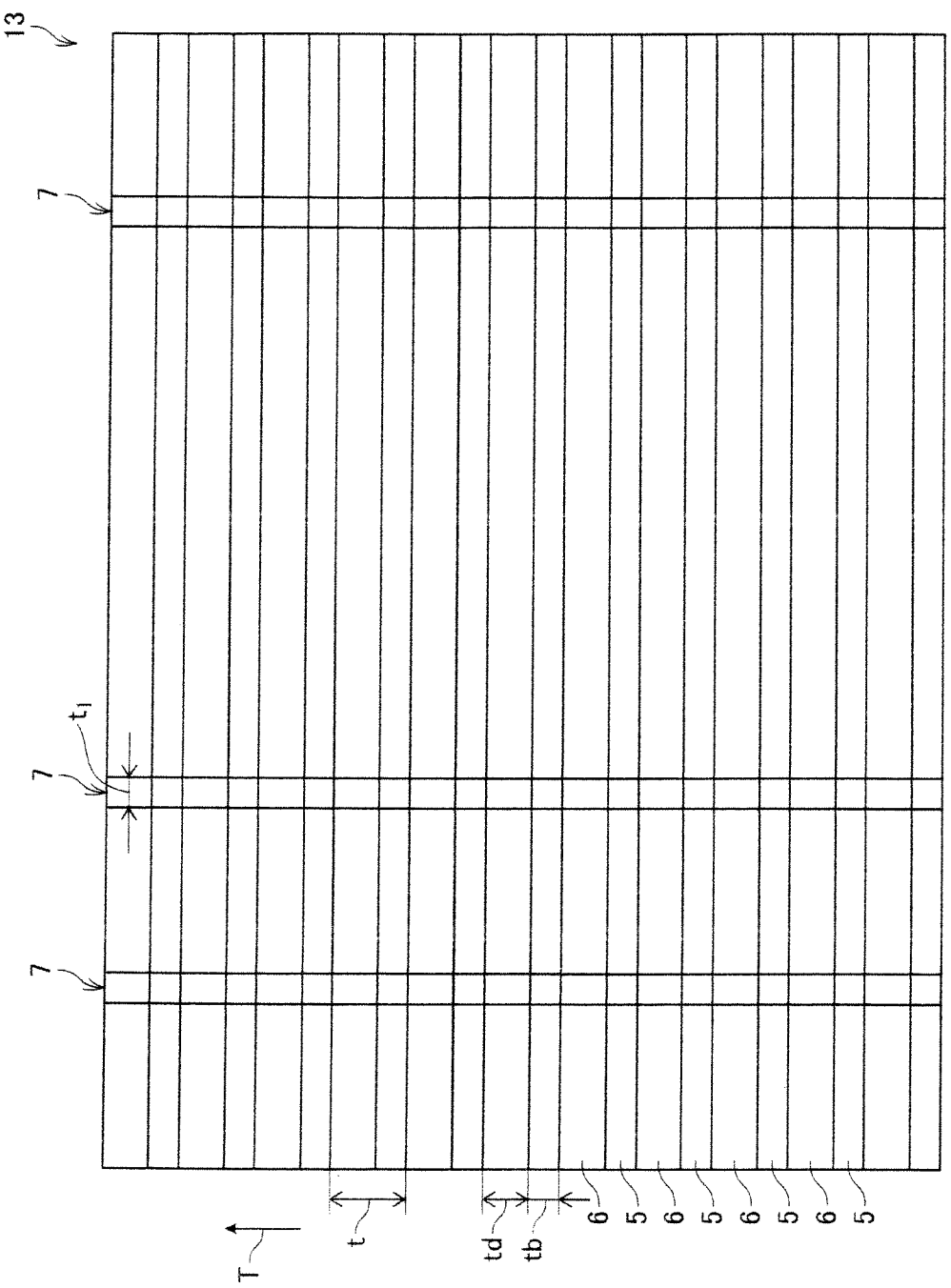

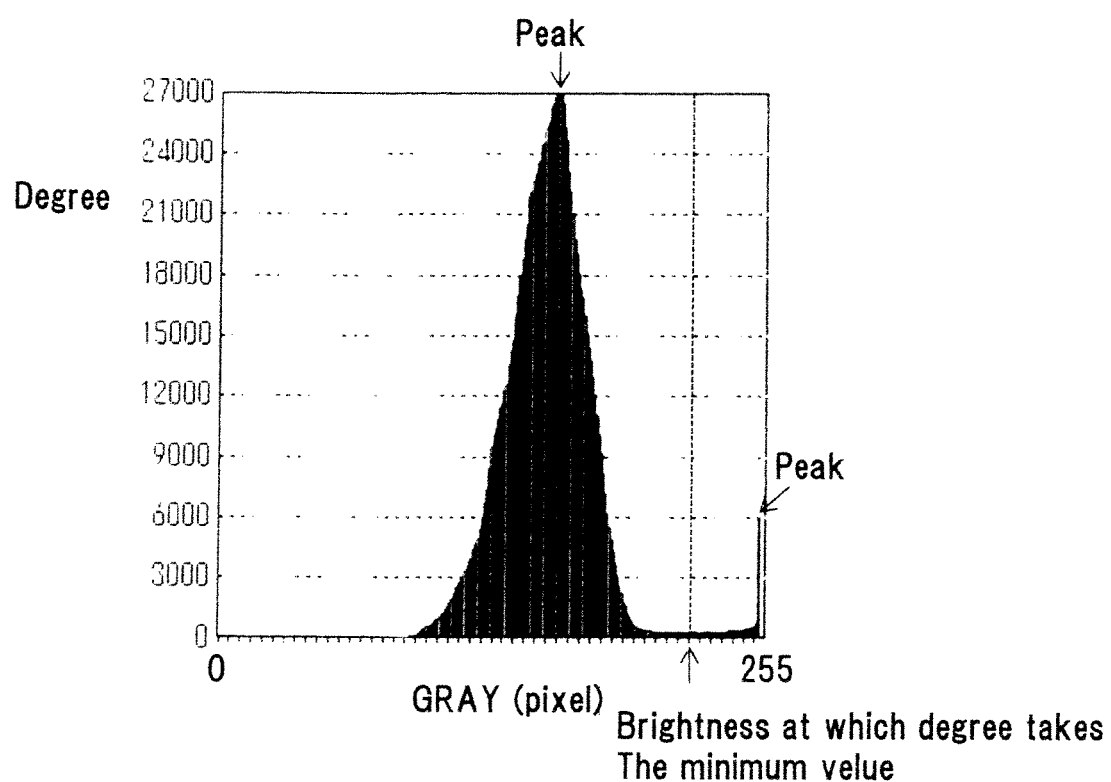

GROUP 13 ELEMENT NITRIDE CRYSTAL LAYER, SELF-SUPPORTING SUBSTRATE, AND FUNCTIONAL ELEMENT

CROSS-REFERENCE TO RELATED APPLICATIONS

This is a continuation of PCT/JP2020/027467, filed Jul. 15, 2020, which claims priority to Japanese Application No. JP2019-210396 filed on Nov. 21, 2019, the entire contents of which are hereby incorporated by reference.

TECHNICAL FIELD

The present invention relates to a group 13 nitride crystal layer, free-standing substrate and functional element.

BACKGROUND ARTS

Recently, the research of growing high-quality and large size gallium nitride crystal by flux method has attracted attention. Such a gallium nitride crystal is expected for a power device for an automobile part or semiconductor part as well as a light-emitting device.

Recently, technical research of controlling the fine structure of such gallium nitride crystals has been developed. For example, according to FIG. 5 of non-patent document 1 and FIG. 7(a) of non-patent document 2, the cross section (cross section in the thickness direction of a GaN layer) perpendicular to GaN (0001) plane is observed by a cathode luminescence method.

Further, according to non-patent document 3, the cross section (cross section in the thickness direction of a GaN layer) perpendicular to GaN (0001) plane is observed by a cathode luminescence method, and a low luminescence layer and high luminescence layer are observable as a partial region.

Further, according to a gallium nitride crystal described in patent document 1, the cross section (cross section in the thickness direction of a GaN layer) perpendicular to GaN (0001) plane is observed by cathode luminescence, the luminescence being substantially constant in the thickness direction.

NON-PATENT DOCUMENTS (Non-Patent Document 1)
http://bunseki.kyushu-u.ac.jp/bunseki/media/108.pdf
(Non-Patent Document 2)
Japanese Journal of Applied Physics 54, 105501 (2015)
(Non-Patent Document 3)
Doctoral Thesis in National University Corporation of OSAKA UNIVERSITY, "Nuclear generation control technique for high-speed growth in the Na flux method" authored by Kousuke MURAKAMI (January, 2017)

PATENT DOCUMENTS (Patent document 1) WO 2019-038933A1

SUMMARY OF THE INVENTION

However, the warping of a gallium nitride free-standing substrate produced according to the prior art is typically 100 to 200 μm in φ of 50 mm. It is desired to reduce the warping, for example, to a value of 30 μm or lower in φ of 50 mm.

An object of the present invention is to provide a microstructure capable of reducing the warping of a group 13 nitride crystal layer.

The present invention provides a group 13 nitride crystal layer comprising a group 13 nitride crystal selected from gallium nitride, aluminum nitride, indium nitride or the mixed crystals thereof, said group 13 nitride crystal layer comprising an upper surface and bottom surface, wherein the group 13 nitride crystal layer comprises high-luminance layers and low-luminance layers being present alternately and wherein the low-luminance layers have thicknesses of 3 or larger and 10 or smaller provided that 1 is assigned to a thickness of the high-luminance layer, when a cross section of the group 13 nitride crystal layer cut in a direction perpendicular to the upper surface is observed by cathode luminescence.

The present invention further provides a free-standing substrate comprising the group 13 nitride crystal layer.

The present invention further provides a functional device comprising:
the free-standing substrate; and
a functional layer provided on the group 13 nitride crystal layer.

The present invention further provides a composite substrate comprising:
a supporting substrate; and
the group 13 nitride crystal layer provided on the supporting substrate.

According to the present invention, in the case where the cross section of the group 13 nitride crystal layer cut along a direction perpendicular to the upper surface is observed by cathode luminescence, the high-luminance layers and low-luminance layers are present alternately, and the low-luminance layers have thicknesses of 3 or larger and 10 or smaller provided that 1 is assigned to a thickness of the high-luminance layer. Such microstructure observable by the cathode luminescence means the microstructure in which the thinner high-luminance layers rich in dopants and impurity metals and the thicker low-luminance layers containing less dopants and impurity metals are alternately laminated. It was found that such microstructure functions as a kind of super-lattice structure to reduce the physical warping of the group 13 nitride crystal layer. The present invention is thus made.

BRIEF DESCRIPTION OF THE DRAWINGS

FIG. 5 is a diagram illustrating the group 13 nitride crystal of FIG. 4.

FIG. 6 shows a histogram of gray scale generated from the CL image.

Figure 1A:
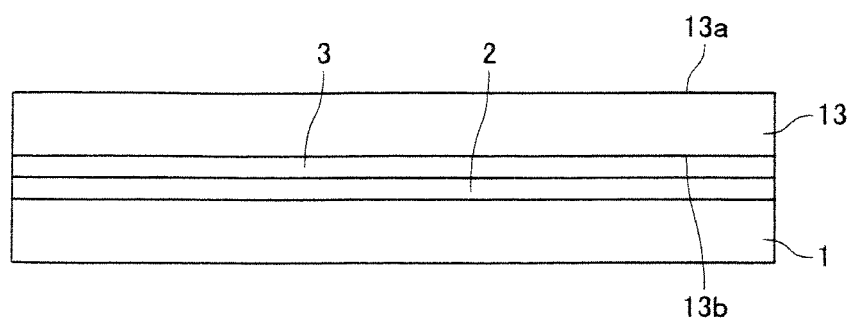
FIG. 1(a) shows the state that an alumina layer, seed crystal layer and group 13 nitride crystal layer are provided on a supporting substrate.

MODES FOR CARRYING OUT THE INVENTION (Group 13 Nitride Crystal Layer)

The group 13 nitride crystal layer of an embodiment of the invention is consisting of a group 13 nitride crystal selected from gallium nitride, aluminum nitride, indium nitride or the mixed crystals thereof and includes an upper surface and bottom surface. For example, as shown in FIG. 1(b), the upper surface 13a and bottom surface 13b of the group 13 nitride crystal layer 13 oppose each other. Further, two main surfaces wider than the other surfaces of the group 13 nitride crystal layer are defined as the upper surface and bottom surface.

The nitride forming the group 13 nitride crystal layer is gallium nitride, aluminum nitride, indium nitride or the mixed crystals thereof. Specifically, it may be GaN, AlN, InN, $Ga_xAl_{1-x}N$ (1>x>0), $Ga_xIn_{1-x}N$ (1>x>0), or $Ga_xAl_yIn_zN$ (1>x>0, 1>y>0, x+y+z=1).

More preferably, the nitride forming the group 13 nitride crystal layer is a gallium nitride-based nitride. Specifically, it is GaN, $Ga_xAl_{1-x}N$ (1>x>0.5), $Ga_xIn_{1-x}N$ (1>x>0.4), or $Ga_xAl_yIn_zN$ (1>x>0.5, 1>y>0.3, x+y+z=1).

The group 13 nitride may be further doped with a n-type dopant or p-type dopant in addition to zinc and calcium. In this case, the polycrystalline group 13 nitride may be used as a member or a layer other than the base material, such as a p-type electrode, or an n-type electrode, a p-type layer, or an n-type layer. A preferable example of a p-type dopant may be one or more selected from the group consisting of beryllium (Be), magnesium (Mg), strontium (Sr) and cadmium (Cd). A preferable example of a n-type dopant may be one or more selected from the group consisting of silicon (Si), germanium (Ge), tin (Sn), and oxygen (O).

According to an embodiment of the present invention, in the case where the cross section of the group 13 nitride crystal layer cut along a direction T perpendicular to the upper surface is observed by cathode luminescence, the high-luminance layers and low-luminance layers are present alternately, and the low-luminance layers have thicknesses of 3 or larger and 10 or smaller provided that 1 is assigned to a thickness of the high-luminance layer.

Figure 3:
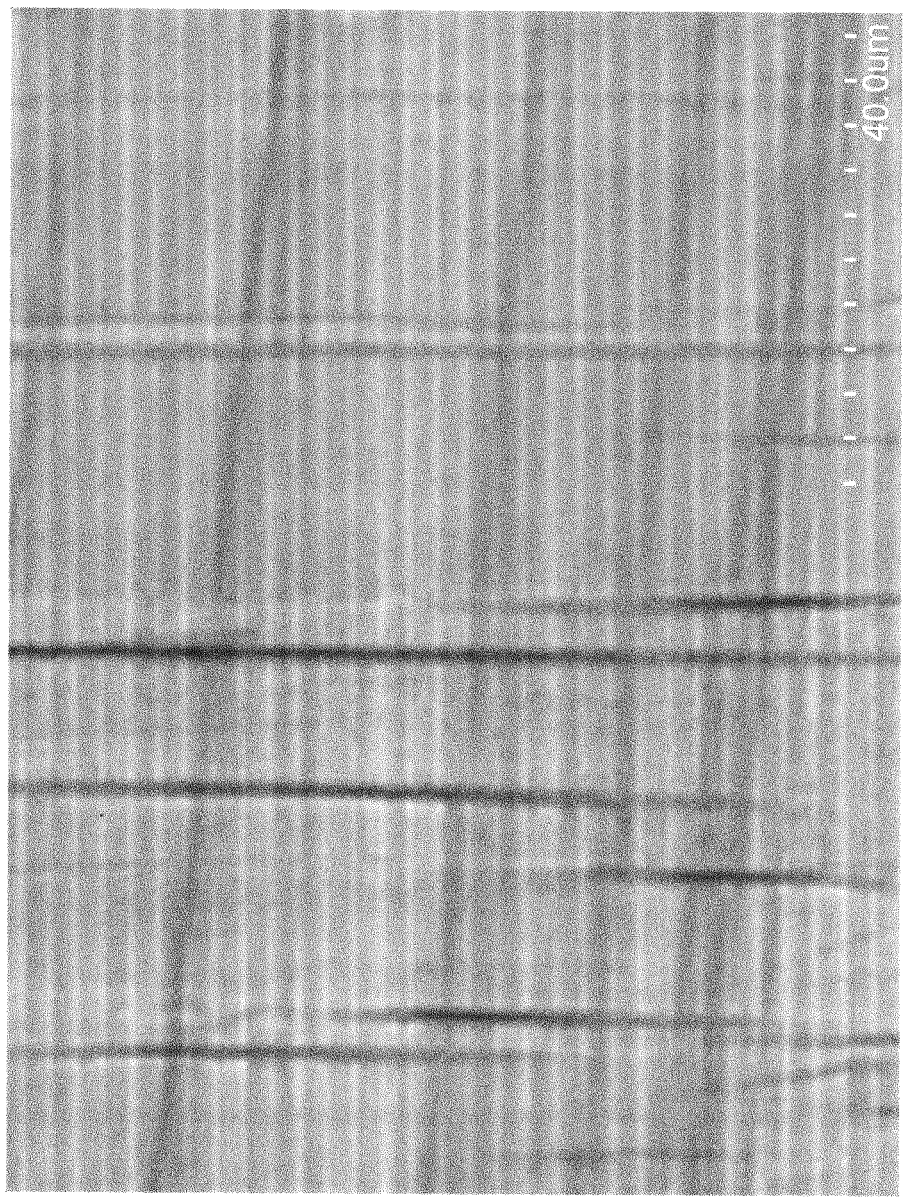
FIG. 3 is a photograph showing the results of measurement of the cross section of the group 13 nitride crystal layer of the present invention by cathode luminescence.

That is, as shown in FIG. 3, the group 13 nitride crystal layer includes the relatively bright band-shaped high-luminance layers and relatively dark low-luminance layers, measured by cathode luminescence. As a part of FIG. 3 is enlarged, the enlarged photograph of FIG. 4 and illustrating diagram of FIG. 5 are obtained.

As shown in FIG. 5, the cross section (cross section shown in FIGS. 3 to 5) cut along the direction T perpendicular to the upper surface 13a of the group 13 nitride crystal layer 13 was observed by cathode luminescence. At this time, the band-shaped high-luminance layers 5 and band-shaped low-luminance layers 6 are present alternately. Then, provided that 1 is assigned to the thickness tb of the high-luminance layer 5, the thickness td of the low-luminance layer 6 is 3 or larger and 10 or smaller. By providing such repetitive structure including the high-luminance layers and relatively thicker low-luminance layers, warping of the group 13 nitride crystal layer is suppressed.

That is, the high-luminance layer is a layer rich in dopants or impurity metals included during the crystal growth, and much dopants or impurity metals are not included and the luminance is lessened in the low-luminance layer. Such microstructure functions as a kind of superlattice structure to suppress the physical warping of the group 13 nitride crystal layer.

Provided that 1 is assigned to the thickness tb of the high-luminance layer 5, the thickness td of the low-luminance layer 6 is 3 or larger. Further, td is 10 or smaller and is preferably 7 or smaller practically.

Further, it is permitted that the ratio of the thickness of the low-luminance layer with respect to the thickness of the high-luminance layer may be occasionally out of a range of 3 to 10, but it is preferred that such combination occupies 1 percent or less of the whole.

Further, according to a preferred embodiment, the total value t of the thickness tb of one high-luminance layer and one low-luminance layer adjacent to each other is 4 µm or smaller. This means that the superlattice-like microstructure composed of the high-luminance layers and low-luminance layers is finer. As such, when the total value t of the thickness tb of the high-luminance layer and the thickness td of the low-luminance layer is 4 µm or smaller, the warping of the group 13 nitride crystal layer can be further reduced. The total value t of the thickness of the one high-luminance layer and of the thickness of the one low-luminance layer is more preferably 3 µm or smaller. Further, the total value t of the one high-luminance layer and one low-luminance layer may be 1 µm or larger in many cases from a practical viewpoint.

Further, the total value t of the thickness tb of the high-luminance layer and thickness td of the low-luminance layer is preferably near a constant value in the thickness direction of the group 13 nitride crystal layer, and the ratio of the maximum value and minimum value of t in the thickness direction is preferably 1.8 or lower in every part. Further, the ratio of the maximum value and minimum value of t in the thickness direction is preferably 1.5 or lower.

Further, according to a preferred embodiment, a low-luminance band extending in a direction intersecting the upper surface of the group 13 nitride crystal layer is provided. For example, according to FIGS. 4 and 5, a low-luminance band 7 is extended in the direction intersecting the upper surface. It is considered that crystals including sparse dopants or impurities are deposited in the growth direction during the crystal growth to generate the low-luminance band 7 which is band-shaped or stripe-shaped as a whole. It is considered that such a low-luminance band functions to reduce the warping of the group 13 nitride crystal layer.

The width t1 of such a low-luminance band 7 is preferably 0.5 µm or larger and more preferably 1 µm or larger, from the viewpoint of the present invention. Further, the width t1 of the low-luminance band 7 is preferably 5 µm or smaller and more preferably 3 µm or smaller.

Further, the intersecting angle of the normal line to the upper surface of the group 13 nitride crystal layer and low-luminance band 7 is preferably −30 to +30° and more preferably −10 to 10°.

According to a preferred embodiment, the upper surface of the group 13 nitride crystal layer is substantially of c-plane. That is, the group 13 nitride crystal has wurtzite crystal structure including c-plane, a-plane and m-plane. Here, the upper surface of the group 13 nitride crystal layer is substantially of c-plane, meaning that it is not limited to c-plane from a geometrically strict sense and it is permitted that it is inclined with respect to the geometrically strict c-plane at 10° or smaller.

The method of measuring the low-luminance layer, high-luminance layer and low-luminance band will be described below.

A scanning type electron microscope (SEM) with a cathode luminescence detector for the cathode luminescence observation is used. For example, in the case where a scanning type electron microscope ("S-3400N" supplied by HITACHI Hi Technologies Co. Ltd.) equipped with a Mini CL system produced by Gatan is used, it is preferred to perform the observation by inserting the CL detector between a sample and an object lens under the measurement conditions of an acceleration voltage of 10 kV, probe current "90", at a working distance (W. D.) of 21 mm and a magnitude of 600 folds or more.

Further, the high-luminance layer, and low-luminance layer and low-luminance band are distinguished based on the observation by means of cathode luminescence.

Based on the brightness of an image observed by CL at an acceleration voltage of 10 kV, probe current "90", at a working distance (W. D.) of 21 mm and a magnitude of 600 folds, an image processing software (for example, "Win-Roof Ver 6. 1.3" supplied by Mitani corporation) is used to prepare a histogram of a gray scale of 256 grades whose vertical axis shows a degree and horizontal axis shows brightness (GRAY). As shown in FIG. 6, two peaks are confirmed in the histogram. The brightness at which the degree takes its minimum value between the two peaks is defined as a boundary, and the higher side is defined as the high-luminance layer and the lower side is defined as the low-luminance layer or low-luminance band.

(Preferred Production Example)

Preferred methods of producing the group 13 nitride crystal layer will be further described.

The group 13 nitride crystal layer of the present invention can be produced by forming a seed crystal layer on an underlying substrate and by forming a layer composed of the group 13 nitride crystal thereon.

Figure 1B:
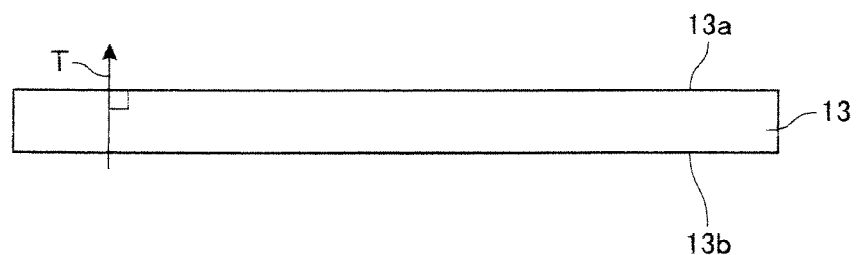
FIG. 1(b) shows the group 13 nitride crystal layer separated from the supporting substrate.

For example, as illustrated in FIG. 1, an alumina layer 2 is formed on a single crystal substrate 1, which can be used as the underlying layer. The single crystal substrate 1 may be composed of sapphire, AlN template, GaN template, free-standing GaN substrate, SiC single crystal, MgO single crystal, spinel ($MgAl_2O_4$), $LiAlO_2$, $LiGaO_2$, and perovskite composite oxide such as $LaAlO_3$, $LaGaO_3$ or $NdGaO_3$ or SCAM ($ScAlMgO_4$). A cubic perovskite composite oxide represented by the composition formula $[A_{1-y}(Sr_{1-x}Ba_x)_y][(Al_{1-z}Ga_z)_{1-u}D_u]O_3$ (wherein A is a rare earth element; D is one or more element selected from the group consisting of niobium and tantalum; y=0.3 to 0.98; x=0 to 1; z=0 to 1; u=0.15 to 0.49; and x+z=0.1 to 2) is also applicable.

The method of forming the alumina layer 2 includes known methods such as sputtering, MBE (molecular beam epitaxy), vapor deposition, mist CVD method, sol-gel method, aerosol deposition (AD) method, and the method of producing an alumina sheet by tape casting or the like and adhering the alumina sheet onto the single crystal substrate, and sputtering is particularly preferred. Optionally, the alumina layer may be subjected to heat treatment, plasma treatment or ion beam irradiation after the formation. The method of heat treatment is not particularly limited, and the heat treatment may be performed under an air atmosphere, vacuum, reducing atmosphere such as hydrogen or the like or inert atmosphere such as nitrogen, argon or the like. The heat treatment may be further performed under pressure using a hot press (HP) furnace, a hot isostatic press (HIP) furnace or the like.

Further, as the underlying substrate, a sapphire substrate subjected to heat treatment, plasma treatment or ion beam irradiation as described above may also be used.

Then, for example as shown in FIG. 1(*a*), a seed crystal layer 3 is provided on the alumina layer 2 produced as described above or on the single crystal substrate 1 subjected to the heat treatment, plasma treatment or ion beam irradiation as described above. The material forming the seed crystal layer 3 is composed of one or more kinds of a nitride of a group 13 element defined by IUPAC. The group 13 element is preferably gallium, aluminum, or indium. Further, specifically, the crystal of the group 13 nitride is preferably GaN, AlN, InN, $Ga_xAl_{1-x}N$ (1>x>0), $Ga_xIn_{1-x}N$ (1>x>0), $Ga_xAl_yInN_{1-x-y}$ (1>x>0, 1>y>0).

Although the method of producing the seed crystal layer 3 is not particularly limited, it is preferably a gas phase method such as MOCVD (metal-organic chemical vapor deposition method), MBE (molecular beams epitaxy method), HVPE (hydride vapor phase epitaxy method), sputtering or the like, a liquid phase method such as sodium flux method, ammono-thermal method, hydrothermal method, sol-gel method or the like, or a powder method utilizing the solid phase growth of powder and combinations thereof.

For example, the formation of the seed crystal layer by MOCVD method is preferably performed by depositing a low-temperature growth interference GaN layer at 450 to 550° C. in 20 to 50 nm and by then growing a GaN film having a thickness of 2 to 4 μm at 1000~1200° C.

The group 13 nitride crystal layer can be formed by flux method on the seed crystal layer. Additives in the group 13 nitride crystal layer include carbon, low-melting point metals (tin, bismuth, silver, gold), and high-melting point metals (transition metals such as iron, manganese, titanium, chromium or the like).

The kind of flux used may be flux containing at least one of an alkali metal and alkaline earth metal, and a flux containing sodium is most preferred.

As the flux, raw materials for the group 13 element such as gallium are mixed and used. Such raw materials may be a simple substance of the group 13 element, alloy of the group 13 element or a compound of the group 13 element, and the gallium simple metal is preferred from the viewpoint of handling.

The ratio (molar ratio) of the group 13 element such as gallium/flux (for example sodium) in the melt may be 10 mol % to 30 mol % and more preferably 10 to 20 mol %.

The temperature at which the group 13 nitride crystal layer is grown by flux method is preferably 800 to 1500° C. and more preferably 800 to 1200° C.

The nitrogen partial pressure at which the group 13 nitride crystal is grown by flux method is preferably 2.5 to 5.0 MPa and more preferably 3.0 to 4.0 MPa.

According to a preferred embodiment, in the case that the group 13 nitride crystal is produced by flux method, it is preferred to repeat the agitation of the melt through rotation of a crucible and the termination of the agitation. Further, it is preferred to perform the growth under the conditions that the supersaturation degree of nitrogen in the melt is gradually increased.

The method of increasing the supersaturation degree of nitrogen in the melt includes the method of lowering the solubility of nitrogen and the method of increasing the amount of dissolved nitrogen.

The method of lowering the solubility of nitrogen includes the method of lowering the crystal growth temperature.

Further, the method of facilitating the dissolution of nitrogen into the melt and to increase the amount of dissolved nitrogen includes the followings:

(1) the nitrogen pressure is gradually increased during the crystal growth;

(2) in the embodiment in which the agitation of the melt through the rotation of the crucible and the termination of the agitation are repeated, a rate increasing step of increasing the rotational rate from zero agitation rate to a target agitation rate and a rate decreasing step of decreasing the rate from the target rotational rate to zero agitation rate are included. In this case, a plurality of the rate-increasing steps and a plurality of rate-decreasing steps are performed during the crystal growth step. In this embodiment, the acceleration can be gradually increased in the rate-increasing step during the crystal growth step, so that the agitation of the melt can be strongly facilitated. The acceleration in the rate-descending step can be gradually increased during the crystal growth step so that the agitation of the melt can be strongly facilitated.

Further, the thus obtained group 13 nitride crystal layer obtained by flux method is preferably ground by grinding stones to flatten the plate face, followed by lapping using diamond abrasives to flatten the plate face.

(Separation of Group 13 Nitride Crystal Layer)

The group 13 nitride crystal layer is then separated from the single crystal substrate so that a free-standing substrate including the group 13 nitride crystal layer is obtained.

Here, the method of separating the group 13 nitride crystal layer from the single crystal substrate is not limited. According to a preferred embodiment, the group 13 nitride crystal layer is spontaneously peeled off from the single crystal substrate in a temperature descending step after growing the group 13 nitride crystal layer.

Alternatively, the group 13 nitride crystal layer may be separated from the single crystal substrate by chemical etching.

As an etchant for performing the chemical etching, a strong acid such as sulfuric acid, hydrochloric acid or the like, a mixture of sulfuric acid and phosphoric acid, or a strong alkali such as sodium hydroxide aqueous solution, potassium hydroxide aqueous solution or the like are preferred. The temperature for performing the chemical etching is preferably 70° C. or higher.

Alternatively, the crystal layer of the group 13 nitride may be separated from the single crystal substrate by a laser lift-off method.

Alternatively, the crystal layer of the group 13 nitride may be separated from the single crystal substrate by grinding.

Alternatively, the crystal layer of the group 13 nitride may be separated from the single crystal substrate with a wire saw.

(Free-Standing Substrate)

The crystal layer of the group 13 nitride may be separated from the single crystal substrate to obtain a free-standing substrate. The term "free-standing substrate" as used herein means a substrate that is not deformed or broken under its own weight during handling and can be handled as a solid. The free-standing substrate of the present invention can be used not only as a substrate for various types of semiconductor devices such as light emitting devices, but also as a member or a layer other than the base material, such as an electrode (which may be a p-type electrode or an n-type electrode), a p-type layer, or an n-type layer. One or more of the other layer(s) may be further provided on the free-standing substrate.

In the case where the group 13 nitride crystal layer forms a free-standing substrate, the free-standing substrate must have a thickness that allows for free standing and preferably has a thickness of 20 μm or more, more preferably 100 μm or more, and further preferably 300 μm or more. No upper limit should be set on the thickness of the free-standing substrate, but it is realistic to have a thickness of 3000 μm or less in terms of manufacturing cost.

(Composite Substrate)

The crystal layer of the group 13 nitride provided on the single crystal substrate may be used as a template substrate for forming another functional layer, without separating the crystal layer of the group 13 nitride.

(Functional Device)

Although a functional device structure provided on the crystal layer of the group 13 nitride of the invention is not particularly limited, it may have a light-emitting function, rectifying function or electric-power controlling function.

The structure and fabricating method of the light emitting device having the crystal layer of the group 13 nitride of the invention are not particularly limited. Typically, the light emitting device is fabricated by providing a light emitting functional layer on the crystal layer of the group 13 nitride. It will be appreciated that the light emitting device may be fabricated by utilizing the crystal layer of the group 13 nitride as a member or a layer other than the base material, such as an electrode (which may be a p-type electrode or an n-type electrode), a p-type layer, or an n-type layer.

Figure 2:
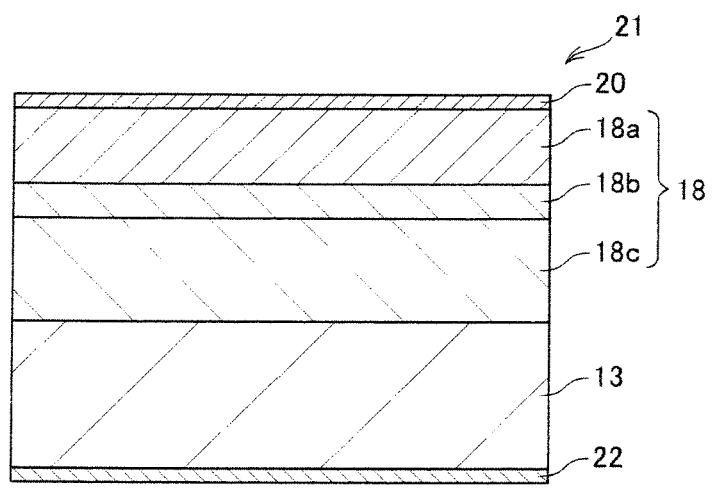
FIG. 2 is a diagram schematically showing a functional device according to the present invention.

FIG. 2 schematically shows the layer configuration of a light emitting device according to an aspect of the present invention. The light emitting device 21 shown in FIG. 2 includes a free-standing substrate 13 and a light emitting functional layer 18 formed on the substrate. The light emitting functional layer 18 provides light emission based on the principle of light emitting devices such as LEDs by appropriately providing electrodes thereon and applying a voltage therebetween.

The light emitting functional layer 18 is formed on the substrate 13. The light emitting functional layer 18 may be provided entirely or partially on the surface of the substrate 13 or may be provided entirely or partially on the surface of a buffer layer to be described hereinafter if formed on the substrate 13. The light emitting functional layer 18 may take various known layer configurations that provide light emission based on the principle of light emitting devices as represented by LEDs by appropriately providing electrodes and/or phosphors thereon and applying a voltage therebetween. Accordingly, the light emitting functional layer 18 may emit visible light of, for example, blue and red or may emit ultraviolet light without or with the visible light. The light emitting functional layer 18 preferably forms at least a part of a light emitting device that exploits a p-n junction and the p-n junction may include an active layer 18b between a p-type layer 18a and an n-type layer 18c, as shown in FIG. 2. Further, 20 and 22 represent examples of electrodes.

Accordingly, one or more layers forming the light emitting functional layer 18 can include at least one or more selected from the group consisting of the n-type layer with n-type dopants doped therein, the p-type layer with p-type dopants doped therein, and the active layer. In the n-type layer, the p-type layer, and the active layer (if one exists), the main component may be of the same material or may be of respectively different materials.

EXAMPLES

Inventive Example 1

(Production of Gallium Nitride Free-Standing Substrate)

An alumina film 2 with a thickness of 0.3 μm was film-formed by sputtering and a seed crystal film 3 composed of gallium nitride and with a thickness of 2 μm was film-formed by the MOCVD method on a sapphire substrate 1 with a diameter of 6 inches to provide a seed crystal substrate.

The seed crystal substrate was placed in an alumina crucible in a glove box filled with a nitrogen atmosphere. Then, gallium metal and sodium metal were filled in the crucible so that the Ga/Ga+Na (mol %) was 15 mol %, and the crucible was closed with an alumina plate. The crucible was contained in an inner container of stainless steel, which was then contained in an outer container of stainless steel capable of including it, and the outer container was then closed with a container lid. The outer container was positioned on a rotatable table provided in a heating part of a crystal production system, and a pressure-resistant container was sealed with a lid.

The inside space of the pressure-resistant container was then evacuated by a vacuum pump to a pressure of 0.1 Pa or less. While an upper heater, middle heater and lower heater were adjusted to heat the heated inside space to 870° C., nitrogen gas was introduced from a nitrogen gas bombe to 4.0 MPa, and the outer container was rotated around a central axis at a rate of 20 rpm clockwise and anti-clockwise at a predetermined interval. The acceleration time was 12 seconds, holding time was 600 seconds, deceleration time was 12 seconds and stopping time was 0.5 seconds. This state was maintained for 40 hours to perform the crystal growth (crystal growth step). During the crystal growth step, the temperature for the crystal growth was gradually lowered in a range of 870° C. and 800° C. under control. After the crystal growth step (after it was held for 40 hours), it was naturally cooled to room temperature and the pressure was reduced to atmospheric pressure. The lid of the pressure-resistant container was then opened and the crucible was taken out from the inside. Solidified sodium metal in the crucible was removed to collect a gallium nitride free-standing substrate without cracks and separated from the seed crystal substrate.

(Evaluation)

Figure 4:
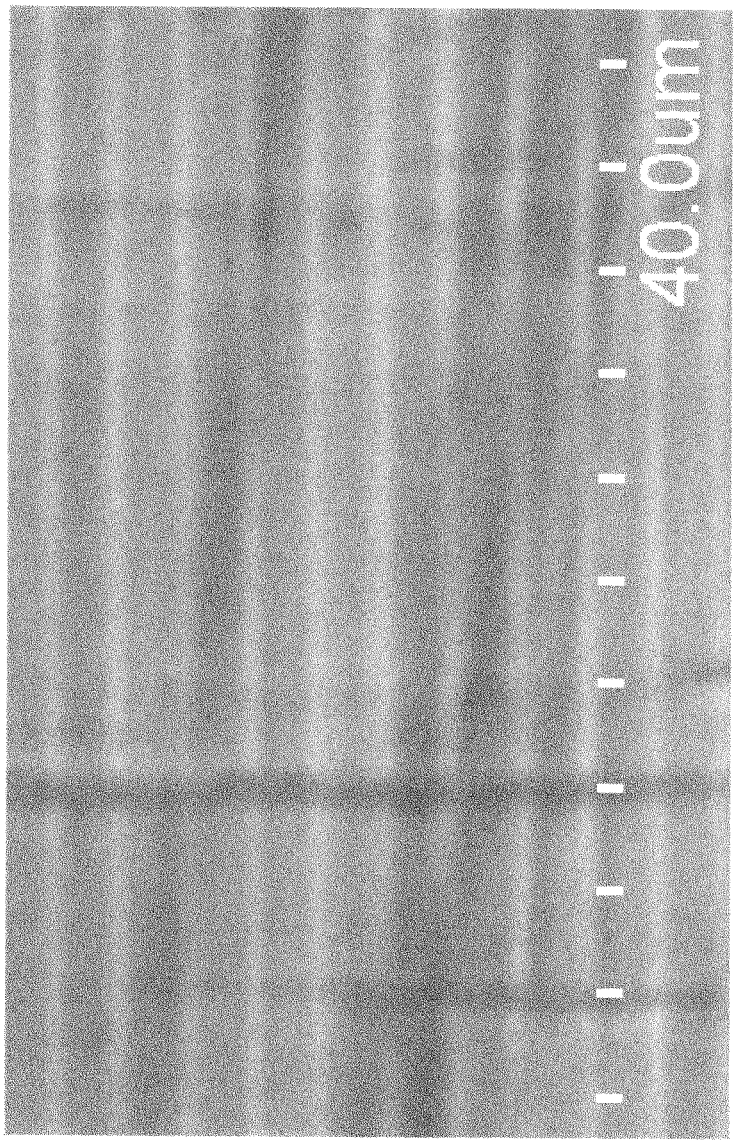
FIG. 4 is a diagram showing an enlarged view of the photograph of FIG. 3.

The cross-section perpendicular to the upper surface of the gallium nitride free-standing substrate was polished and observed by CL by means of the scanning type electron microscope (SEM) with the CL detector as described above. As a result, as shown in FIGS. 3 to 5, the microstructure in which the high-luminance layers and low-luminance layers were alternately formed, inside of the gallium nitride crystal according to the CL photographs, was observed. Further, many low-luminance bands which were inclined with respect to the upper surface by about minus 5° to plus 5° was confirmed. Further, as the same visual field was observed by SEM, voids were not confirmed and uniform gallium nitride crystal was proved to be grown.

The measured values of the thus obtained free-standing substrate of the gallium nitride crystal are shown below. Further, the ratio of the maximum value and minimum value of t in the thickness direction was 1.5.

Thickness td of low-luminance layer: 2.1 μm
Thickness tb of high-luminance layer: 0.7 μm
td+tb (t): 2.8 μm
Width t1 of low-luminance band: 1.1 μm
Warping of free-standing substrate: 20 μm Inventive Example 2

The free-standing substrate of gallium nitride crystal was produced according to the same procedure as that of Inventive Example 1.

Further, in the crystal growth step, the outer container was rotated around a central axis at a rate of 20 rpm clockwise and anticlockwise at a constant interval. The acceleration time was 20 seconds, holding time was 300 seconds, the deceleration time was 20 seconds and stopping time was 0.5 seconds. Thereafter, the container was held for 40 hours. At this time, the temperature during the crystal growth was gradually lowered in a range of 870° C. and 800° C. under control.

The cross-section perpendicular to the upper surface of the gallium nitride free-standing substrate was polished and observed by CL by means of the scanning type electron microscope (SEM) with the CL detector as described above. As a result, as shown in FIGS. 3 to 5, the microstructure in which the high-luminance layers and low-luminance layers were alternately formed, inside of the gallium nitride crystal according to the CL photographs, was observed. Further, many low-luminance bands which were inclined with respect to the upper surface by about minus 5°5 to plus 5° were confirmed. Further, as the same visual field was observed by SEM, voids were not confirmed and uniform gallium nitride crystal was proved to be grown.

The measured values of the thus obtained free-standing substrate of the gallium nitride crystal are shown below. Further, the ratio of the maximum value and minimum value of t in the thickness direction was 1.4.

Thickness td of low-luminance layer: 1.4 μm
Thickness tb of high-luminance layer: 0.4 μm
td+tb (t): 1.8 μm
Width t1 of low-luminance band: 1.0 μm
Warping of free-standing substrate: 18 μm Inventive Example 3

The free-standing substrate of gallium nitride crystal was produced according to the same procedure as that of Inventive Example 1.

Further, in the crystal growth step, the outer container was rotated around a central axis at a rate of 20 rpm clockwise and anticlockwise at a constant interval. The acceleration time was 20 seconds, holding time was 600 seconds, the deceleration time was 20 seconds and stopping time was 0.5 seconds. Thereafter, the container was held for 40 hours. At this time, the pressure during the crystal growth was gradually increased from 3.0 MPa to 4.0 MPa. Further, the temperature during the crystal growth was constant as 870° C.

The cross-section perpendicular to the upper surface of the gallium nitride free-standing substrate was polished and observed by CL by means of the scanning type electron microscope (SEM) with the CL detector as described above. As a result, as shown in FIGS. 3 to 5, the microstructure in which the high-luminance layers and low-luminance layers were alternately formed, inside of the gallium nitride crystal according to the CL photographs, was observed. Further, many low-luminance bands which were inclined with respect to the upper surface by about minus 5° to plus 5° were confirmed. Further, as the same visual field was observed by SEM, voids were not confirmed and uniform gallium nitride crystal was proved to be grown.

The measured values of the thus obtained free-standing substrate of the gallium nitride crystal are shown below. Further, the ratio of the maximum value and minimum value of t in the thickness direction was 1.6.

Thickness td of low-luminance layer: 1.2 μm
Thickness tb of high-luminance layer: 0.2 μm
td+tb (t): 1.4 μm
Width t1 of low-luminance band: 1.5 μm
Warping of free-standing substrate: 22 μm Comparative Example 1

The free-standing substrate of gallium nitride crystal layer was produced according to the same procedure as that of Inventive Example 1.

However, different from Inventive Example 1, during the crystal growth step, the temperature during the crystal growth was constant as 870° C.

The cross-section perpendicular to the upper surface of the thus obtained gallium nitride free-standing substrate was polished and observed by CL by means of the scanning type electron microscope (SEM) with the CL detector as described above. As a result, the microstructure in which the high-luminance layers and low-luminance layers were alternately formed, inside of the gallium nitride crystal according to the CL photographs were observed. Further, many low-luminance bands which were inclined with respect to the upper surface by about minus 5° to plus 5° were confirmed. Further, as the same visual field was observed by SEM, voids were not confirmed and uniform gallium nitride crystal was proved to be grown.

The measured values of the thus obtained free-standing substrate of the gallium nitride crystal are shown below. Further, the ratio of the maximum value and minimum value of t in the thickness direction was 2.1.

Thickness td of low-luminance layer: 2.1 μm
Thickness tb of high-luminance layer: 0.7 μm
td+tb (t): 2.8 μm
Width t1 of low-luminance band: 1.1 μm
Warping of free-standing substrate: 60 μm Comparative Example 2

The free-standing substrate of gallium nitride crystal was produced according to the same procedure as that of Inventive Example 1.

However, different from Inventive Example 1, during the crystal growth step, the temperature during the crystal growth was constant as 870° C. Further, the outer container was rotated unidirectionally around a central axis at a rate of 20 rpm and it was held for 40 hours.

As a result, the cross-section perpendicular to the upper surface of the thus obtained gallium nitride free-standing substrate was polished and observed by CL by means of the scanning type electron microscope (SEM) with the CL detector as described above. Consequently, the brightness of the gallium nitride crystal was substantially constant. Further, as the same visual field was observed by SEM, voids were not confirmed and uniform gallium nitride crystal was proved to be grown.

The warping of the thus obtained free-standing substrate was 130 μm.

The invention claimed is:

1. A group 13 nitride crystal layer comprising a group 13 nitride crystal selected from gallium nitride, aluminum nitride, indium nitride or the mixed crystals thereof, said group 13 nitride crystal layer comprising an upper surface and bottom surface,
wherein said group 13 nitride crystal layer comprises high-luminance layers and low-luminance layers, each high-luminance layer being a layer that has a brightness higher side when observed by cathode luminescence and each low-luminance layer being a layer that has a brightness lower side when observed by cathode luminescence, the high-luminance layers and low-luminance layers being present alternately and wherein each said low-luminance layer has a thickness of between 3 times and 10 times of a thickness of each said high-luminance layer, wherein each said high-luminance layer comprises an n-type dopant or a p-type dopant and each said low-luminance layer comprises an n-type dopant or a p-type dopant in a lesser amount with respect to the high-luminance layers.

2. The group 13 nitride crystal layer of claim 1, wherein a total of thicknesses of one of said high-luminance layers and one of said low-luminance layers adjacent to each other is 4 μm or smaller and 1 μm or larger.

3. The group 13 nitride crystal layer of claim 1, further comprising a low-luminance band extending in a direction intersecting said upper surface.

4. The group 13 nitride crystal layer of claim 1, wherein each of said high-luminance layers and one of said low-luminance layers adjacent to said high-luminance layer has a total thickness, the total thickness varying and having a maximum value and minimum value, a ratio of the maximum value to the minimum value being 1.8 or smaller.

5. The group 13 nitride crystal layer of claim 1, wherein said group 13 nitride crystal comprises a gallium nitride-series nitride.

6. The group 13 nitride crystal layer of claim 1, wherein said upper surface of said group 13 nitride crystal layer is of c-plane or is inclined with respect to said c-plane at an angle of 10° or less.

7. A free-standing substrate comprising the group 13 nitride crystal layer of claim 1.

8. A functional device comprising:
the free-standing substrate of claim 7; and
a functional layer provided on said group 13 nitride crystal layer.

9. The functional device of claim 8, wherein said functional layer comprises a light-emitting function, a rectifying function or an electric-power controlling function.

10. The group 13 nitride crystal layer of claim 1, wherein said p-type dopant is selected from the group consisting of beryllium, magnesium, strontium, and cadmium, and said n-type dopant is selected from the group consisting of silicon, germanium, tin, and oxygen.

11. The group 13 nitride crystal layer of claim 1, wherein said group 13 nitride crystal layer comprises gallium nitride.

12. A composite substrate comprising:
a supporting substrate; and
the group 13 nitride crystal layer of claim 1 and provided on said supporting substrate.

13. A functional device comprising:
the composite substrate of claim 12; and
a functional layer provided on said group 13 nitride crystal layer.

14. The functional device of claim 13, wherein said functional layer comprises a light-emitting function, a rectifying function or an electric-power controlling function.

* * * * *